(12) United States Patent
Yuasa et al.

(10) Patent No.: US 10,319,889 B2
(45) Date of Patent: Jun. 11, 2019

(54) LIGHT EMITTING DEVICE

(71) Applicant: NICHIA CORPORATION, Anan-shi (JP)

(72) Inventors: Taiki Yuasa, Tokushima (JP); Tomohisa Kishimoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/832,779

(22) Filed: Dec. 6, 2017

(65) Prior Publication Data
US 2018/0182942 A1     Jun. 28, 2018

(30) Foreign Application Priority Data

Dec. 27, 2016  (JP) ................................ 2016-253490
Apr. 5, 2017   (JP) ................................ 2017-074869

(51) Int. Cl.
*H01L 33/60* (2010.01)
*H01L 33/50* (2010.01)
(Continued)

(52) U.S. Cl.
CPC ............ *H01L 33/60* (2013.01); *H01L 33/504* (2013.01); *H01L 33/507* (2013.01); *H01L 33/54* (2013.01);
(Continued)

(58) Field of Classification Search
CPC ....... H01L 2924/00; H01L 2224/48091; H01L 2924/00014; H01L 2924/181;
(Continued)

(56) References Cited

U.S. PATENT DOCUMENTS 6,650,044 B1 * 11/2003 Lowery ................. H01L 33/505
                                                              313/498
6,956,247 B1 * 10/2005 Stockman ............... H01L 33/50
                                                               257/94

(Continued)

FOREIGN PATENT DOCUMENTS

JP     2004-071726     3/2004
JP     2004-119984     4/2004
(Continued)

*Primary Examiner* — Jonathan Han
(74) *Attorney, Agent, or Firm* — Mori & Ward, LLP (57) ABSTRACT

A light emitting device includes a light emitting element having a light emitting surface from which the light emitting element is configured to emit a first light having a first peak wavelength. A light transform layer is provided on the light emitting surface to transform the first light to a second light having a second peak wavelength longer than the first peak wavelength. A light-transmissive layer is provided on the light transform layer and includes a first surface that has a substantially flat shape and that is opposite to the light emitting surface and a second surface connected to the first surface and having a curved shape to surround the light emitting element. A reflecting film is provided between the light transform layer and the light-transmissive layer to extend along the first surface and the second surface so as to reflect the first light and to transmit the second light.

22 Claims, 5 Drawing Sheets

(51) Int. Cl.
  *H01L 33/54* (2010.01)
  *H01L 33/62* (2010.01)
  *H01L 33/32* (2010.01)

(52) U.S. Cl.
  CPC .............. *H01L 33/62* (2013.01); *H01L 33/32* (2013.01); *H01L 2933/0033* (2013.01); *H01L 2933/0041* (2013.01); *H01L 2933/0058* (2013.01)

(58) Field of Classification Search
  CPC ... H01L 2924/0002; H01L 2224/73265; H01L 2924/00012; H01L 33/486; H01L 33/50; H01L 33/505; H01L 33/507; H01L 33/58
  USPC ............ 257/98, E33.061, 99; 438/27, 29, 26
  See application file for complete search history.

(56) References Cited

U.S. PATENT DOCUMENTS

| | | |
|---|---|---|
| 2004/0061124 A1 | 4/2004 | Trottier et al. |
| 2008/0023712 A1* | 1/2008 | Mueller ................. C04B 35/01 257/98 |
| 2008/0179609 A1* | 7/2008 | Trottier ................... H01L 33/44 257/98 |
| 2011/0031516 A1* | 2/2011 | Basin .................... H01L 33/507 257/98 |
| 2013/0214312 A1* | 8/2013 | Sohn .................... H01L 33/507 257/98 |
| 2015/0085467 A1 | 3/2015 | Tsumori et al. |
| 2015/0184813 A1* | 7/2015 | Harbers ............. C09K 11/0883 362/84 |

FOREIGN PATENT DOCUMENTS

| | | |
|---|---|---|
| JP | 2005-228996 | 8/2005 |
| JP | 2007-088348 | 4/2007 |
| JP | 2007-184326 | 7/2007 |
| JP | 2007-184330 | 7/2007 |
| JP | 2008-311532 | 12/2008 |
| JP | 2009-182241 | 8/2009 |
| JP | 2011-243977 | 12/2011 |
| JP | 2012-174985 | 9/2012 |
| JP | 2015-088220 | 5/2015 |
| JP | 2015-088483 | 5/2015 |
| JP | 2016-197756 | 11/2016 |

* cited by examiner

LIGHT EMITTING DEVICE

CROSS-REFERENCE TO RELATED APPLICATIONS

The present application claims priority under 35 U. S. C. § 119 to Japanese Patent Application No. 2016-253490, filed Dec. 27, 2016, and Japanese Patent Application No. 2017-074869, filed Apr. 5, 2017. The contents of these applications are incorporated herein by reference in their entirety.

BACKGROUND OF THE INVENTION

Field of the Invention

The present invention relates to a light emitting device.

Discussion of the Background

A light emitting device including a light emitting diode (LED) has been widely used as a display, a warning lamp, an indicating lamp, and an illuminating lamp.

For example, a light has been known that forms a vehicle tale lamp and a vehicle brake lamp that emit red light by a blue light emitting diode that emits blue light and a fluorescent material that converts the light from the blue light emitting diode to red light (see, for example, Japanese Unexamined Patent Application Publication Nos. 2015-88220 and 2015-88483).

SUMMARY OF THE INVENTION

According to one aspect of the present invention, a light emitting device includes a light emitting element, a light transform layer, a light-transmissive layer, and a reflecting film. The light emitting element has a light emitting surface from which the light emitting element is configured to emit a first light having a first peak wavelength. The light transform layer is provided on the light emitting surface to transform the first light to a second light having a second peak wavelength longer than the first peak wavelength. The light-transmissive layer is provided on the light transform layer and includes a first surface and a second surface. The first surface has a substantially flat shape and is opposite to the light emitting surface. The second surface is connected to the first surface and has a curved shape to surround the light emitting element. The reflecting film is provided between the light transform layer and the light-transmissive layer to extend along the first surface and the second surface so as to reflect the first light and to transmit the second light.

According to another aspect of the present invention, a light emitting device includes a light emitting element, a light transform layer, a reflecting film, and a light-transmissive layer. The light emitting element has a light emitting surface from which the light emitting element is configured to emit a first light in a light emitting direction. The first light having a first peak wavelength. The light transform layer is provided on the light emitting surface to transform the first light to a second light having a second peak wavelength longer than the first peak wavelength. The reflecting film is provided on the light transform layer to reflect the first light and to transmit the second light. The light-transmissive layer is provided between the light transform layer and the reflecting film and includes a first surface, a third surface, and a fourth surface. The first surface has a substantially flat shape and is opposite to the light emitting surface. The third surface has a substantially flat shape and is opposite to the first surface in the light emitting direction. The fourth surface is connected to the third surface and has a curved shape to surround the light emitting element. The light-transmissive layer extends along the third surface and the fourth surface.

According to further aspect of the present invention, a method of manufacturing a light emitting device includes providing a light-transmissive layer having a cup shape having a hollow. The light-transmissive layer includes a first surface and a second surface to define the hollow. The first surface is provided at a bottom of the hollow and has a substantially flat shape. The second surface is connected to the first surface and having a curved surface. A reflecting layer is provided on the first surface and the second surface of the light-transmissive layer to extend along the first surface and the second surface. The reflecting layer includes a dielectric multi-layer film in which dielectric layers having different refractive indexes are alternately stacked. A light transform layer is provided on the reflecting layer. A light emitting element is provided on the light transform layer so that a light emitting surface of the light emitting element is opposite to the first surface of the light-transmissive layer.

According to further aspect of the present invention, a method of manufacturing a light emitting device includes providing a light-transmissive layer having a cup shape having an inner peripheral surface to define a hollow of the cup shape and an outer peripheral surface surrounding the inner peripheral surface. The outer peripheral surface includes a third surface and a fourth surface. The third surface is provided opposite to a bottom of the hollow and has a substantially flat shape. The fourth surface is connected to the third surface and has a curved shape to surround the hollow. A reflecting layer is provided on the outer peripheral surface of the light-transmissive layer to extend along the third surface and the fourth surface. The reflecting layer includes a dielectric multi-layer film in which dielectric layers having different refractive indexes are alternately stacked. A light transform layer is provided on the inner peripheral surface of the light-transmissive layer. A light emitting element is provided on the light transform layer so that a light emitting surface of the light emitting element is opposite to the bottom of the hollow in the light-transmissive layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

Hereinafter, light emitting devices according to embodiments are described. The present invention, however, is not limited to these embodiments. The embodiments described below are to exemplify light emitting devices for embodying technical ideas of the present invention, and the present invention is not to be limited to the light emitting devices described below.

The relationship between names of colors and chromaticity coordinates, the relationship between wavelength ranges of light and names of monochromatic light, and the like are in conformity with JIS Z8110. Specifically, monochromatic light having a wavelength ranging from 380 nm to 410 is violet, monochromatic light having a wavelength ranging from 410 nm to 455 nm is blue-violet, monochromatic light having a wavelength ranging from 455 nm to 485 nm is blue, monochromatic light having a wavelength ranging from 485 nm to 495 nm is blue-green, monochromatic light having a wavelength ranging from 495 nm to 548 nm is green, monochromatic light having a wavelength ranging from 548 nm to 573 nm is yellow-green, monochromatic light having a wavelength ranging from 573 nm to 584 nm is yellow, monochromatic light having a wavelength ranging from 584 nm to 610 nm is yellow-red, and monochromatic light having a wavelength ranging from 610 nm to 780 nm is red.

In a light emitting device according to a first embodiment and a method of manufacturing the light emitting device, "up," "down," "left," "right," and the like vary according to the situation. In the present specification, "up," "down," and the like indicate a relative position among constituents in a drawing that is referred to for description and are not intended to indicate an absolute position unless otherwise specified.

In the present specification, "on" of, for example, "on" a light emitting element, "on" a fluorescent material layer, and "on" a reflecting film does not restrictively refer to a form in which another member is in contact with these constituents, and may refer to a form in which another member is not in contact with these constituents but is on these constituents with another additional member disposed between the other member and these constituents. For example, a phrase "something is disposed on a member A," i.e., "something is disposed on a light emitting surface of a light emitting element 20" includes cases in which something is provided in contact with the member A and in which something is provided on the member A with another layer interposed between something and the member A.

In the present specification, the numerical range represented by "from" and "to" indicates a range including a value following "from" as the minimum value and a value following "to" as the maximum value. When a composition contains a plurality of substances corresponding to a component, the content of the component in the composition means a total amount of the plurality of substances present in the composition unless otherwise specified.

First Embodiment

Figure 1:
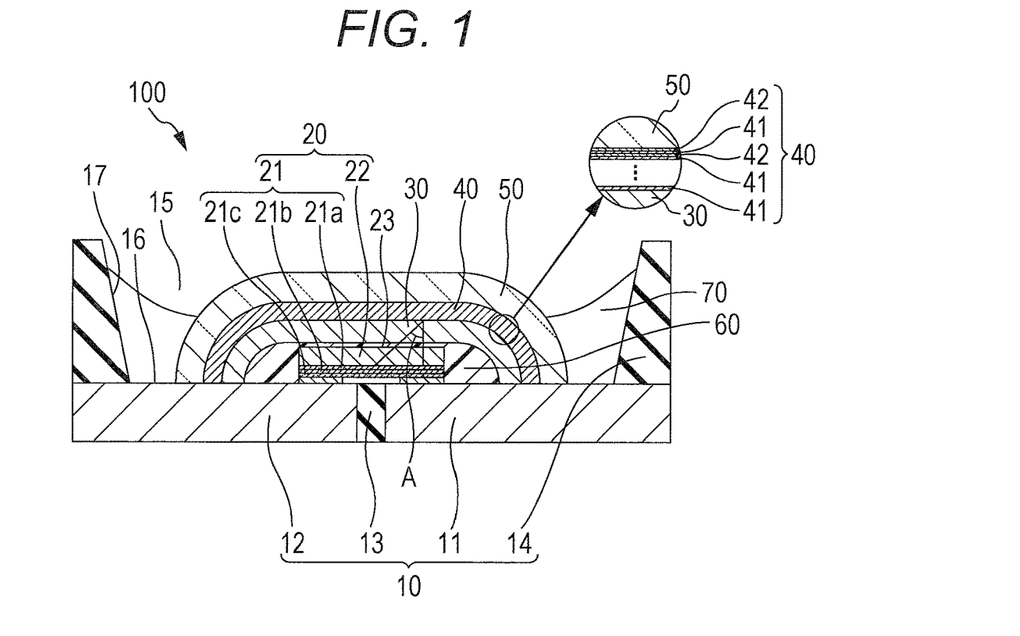
FIG. 1 is a schematic sectional view illustrating one example of a light emitting device according to a first embodiment.
Figure 2:
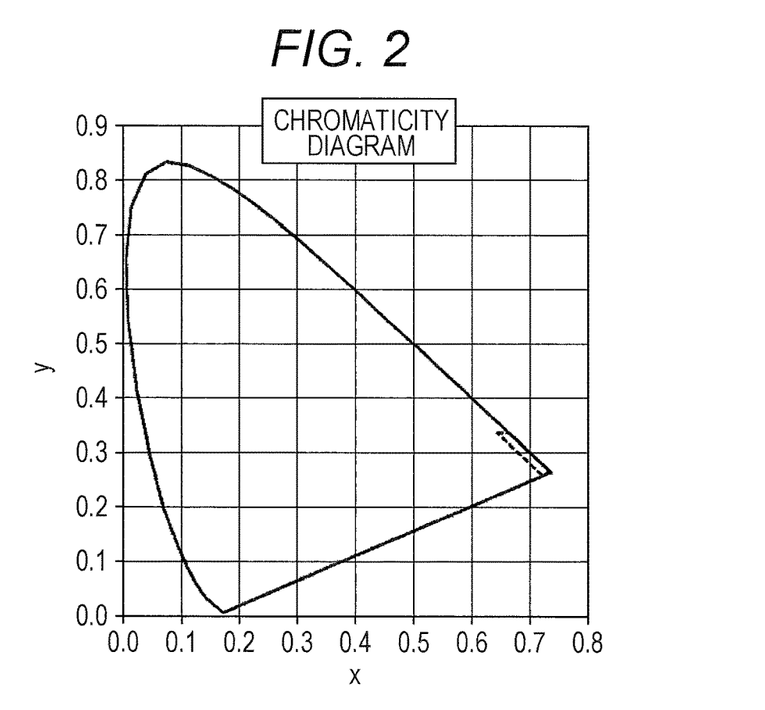
FIG. 2 is a schematic chromaticity diagram illustrating chromaticity coordinates (CIE1931) of light emitted by the light emitting device according to the first embodiment.

Hereinafter, a light emitting device according to the present embodiment is described with reference to drawings. FIG. 1 is a schematic sectional view illustrating one example of a light emitting device according to a first embodiment. FIG. 2 is a schematic chromaticity diagram illustrating chromaticity coordinates (CIE1931) of light emitted by the light emitting device according to the first embodiment. An angle of incidence A of first light to a reflecting film indicates the angle of incidence A illustrated in FIG. 1. The center of an active layer in a plan view of a light emitting element is to be a reference point unless otherwise specified. Assuming that the first light is output from the center of the active layer, the angle of incidence A is defined.

A light emitting device 100 includes a base 10, a light emitting element 20 disposed on the base 10, a fluorescent material layer (a light transform layer) 30 disposed on the light emitting element 20, a reflecting film 40 provided on the fluorescent material layer 30, and a light-transmissive member (a light-transmissive layer) 50 provided on the reflecting film 40. The base 10 includes a first lead 11, a second lead 12, a fixing portion 13 disposed between the first lead 11 and the second lead 12, and a side wall 14 provided on each of the first lead 11 and the second lead 12. The base 10 has a recess portion 15 formed therein, the first lead 11, the second lead 12, and the fixing portion 13 are disposed on an inner bottom surface 16 of the recess portion 15, and the side wall 14 is disposed on an inner side surface 17 of the recess portion 15. The light emitting element 20 is disposed on the inner bottom surface 16 of the recess portion 15 of the base 10, and a resin 70 is disposed in the recess portion 15 of the base 10 so as to be in contact with the light-transmissive member 50. The resin 70 contains a reflecting member. The light emitting element 20 may be disposed on the inner bottom surface 16 of the recess portion 15 with use of a die bonding material such as a metal (e.g., gold and solder) or a resin (e.g., an epoxy resin and a silicone resin). With the inner bottom surface 16 of the recess portion 15 of the base 10 set as a reference level, an uppermost surface of the recess portion 15 of the base 10 is preferred to be positioned higher than a surface of the light-transmissive member 50. This configuration can prevent detachment of the light-transmissive member 50 caused by another member catching the light-transmissive member. The light emitting element 20 includes a light emitting surface 23 on an upper surface side thereof. The light-transmissive member 50 includes a first surface opposite to the light emitting surface 23 of the light emitting element 20 and a second surface bent toward the light emitting element 20 and connected to the first surface. The fluorescent material layer 30 and the reflecting film 40 are preferred to include parts in parallel with the first surface and the second surface of the light-transmissive member 50. In addition, the fluorescent material layer 30, the light-transmissive member 50, and the reflecting film 40 are preferred to be similar figures. The similar figures referred to herein mean little more than similar figures having a flat surface and a bent surface and do not mean strict similar figures having, for example, the same ratio and the same reduced scale.

The reflecting film 40 corresponding to the first surface of the light-transmissive member 50 is preferred to entirely cover the light emitting surface 23 of the light emitting element 20. This is because most part of the light from the light emitting element 20 can be reflected by the reflecting film 40. The phrase "the reflecting film 40 corresponding to the first surface of the light-transmissive member 50" referred to herein mean the reflecting film 40 disposed on the first surface of the light-transmissive member 50. The phrase "the reflecting film 40 corresponding to the first surface entirely covers the light emitting surface 23 of the light emitting element 20" means that the reflecting film covers the light emitting surface with the fluorescent material layer 30 interposed between the reflecting film and the light emitting element.

The light-transmissive member 50 is preferred to form a cup shape including the first surface that is flat. Alternatively, the light-transmissive member can have a tunnel shape including a pair of bent surfaces and the other pair of unbent surfaces.

The light emitting element 20 emits first light having a peak emission wavelength in a wavelength range of 355 nm or longer and 485 nm or shorter. Depending on the characteristics of the reflecting film 40, the light emitting element 20 can be used that emits the first light having a peak emission wavelength in a wavelength range of 355 nm or longer and shorter than 455 nm or the first light having a peak emission wavelength in a wavelength range of 455 nm or longer and 485 nm or shorter. Forming the light-transmissive member 50 and the reflecting film 40 in predetermined shapes enables, even with use of the light emitting element 20 that emits the first light having a peak emission wavelength in a wavelength range of 355 nm or longer and 485 nm or shorter, the reflecting film 40 to reflect most part of the light from the light emitting element 20, so that light emission efficiency of the light emitting device 100 can be enhanced.

The light emitting element 20 includes a semiconductor stacked-layer body 21 and a substrate 22. The semiconductor stacked-layer body 21 includes a first semiconductor layer 21a, an active layer 21b, and a second semiconductor layer 21c stacked in this order. The light emitting element 20 has the light emitting surface on either a substrate 22 side or a semiconductor stacked-layer body 21 side. Here, the light emitting element is face-down mounted, and therefore the light emitting surface is on the substrate 22 side.

The fluorescent material layer 30 contains a fluorescent material that is excited by the first light and emits second light having a wavelength longer than the wavelength of the first light. The fluorescent material layer 30 may be formed of only a fluorescent material. Alternatively, the fluorescent material may be solidified by an organic material such as a resin or by an inorganic material such as ceramics. The fluorescent material layer 30 is excellent in heat resistance when obtained by hardening particles of the fluorescent material through firing. Particles of the fluorescent material dispersed in, for example, an epoxy resin or a silicone resin enables easy formation of the fluorescent material layer 30. The fluorescent material layer is also excellent in heat resistance that is obtained by hardening particles of the fluorescent material and particles of ceramics through firing. The material and method are to be appropriately selected according to the purpose of use and use application of the light emitting device.

The fluorescent material contained in the fluorescent material layer 30 has a peak emission wavelength in a wavelength range of preferably 550 nm or longer and 780 nm or shorter, more preferably 584 nm or longer and 680 nm or shorter. This is because the fluorescent material having a peak emission wavelength in these ranges can enhance light emission brightness. In addition, because the fluorescent material having a peak emission wavelength in these ranges facilitates visual observation of red light emission.

The reflecting film 40 is preferred to be directly or indirectly provided on the light-transmissive member 50. The reflecting film 40 is preferred to be formed depending on the shape of the light-transmissive member 50. That is, when the light-transmissive member 50 forms a cup shape, the reflecting film 40 is preferred to be directly provided on an inner surface of the cup.

The reflecting film 40 has a property of reflecting the first light and transmitting the second light. As regards a reflection spectrum of the reflecting film 40, there can be used the reflecting film 40 having, when being a flat surface, a reflectivity of 95% or more for the first light at an angle of incidence A to the reflecting film 40 of from 0° to a first angle and a reflectivity of 20% or more and 70% or less for the first light at an angle of incidence A of from the first angle to a second angle. In addition, the reflecting film 40 may further include, when being a flat surface, a part having a reflectivity of 20% or less for the first light at an angle of incidence A of from the second angle to a third angle. Use of the reflecting film that is a flat surface largely reduces the reflectivity when the angle of incidence is a predetermined angle or larger to increase light that transmits through the reflecting film. An increase in light that transmits through the reflecting film decreases returning light that returns to the fluorescent material layer 30, resulting in reduction of quantity of the second light released from the light emitting device 100. In contrast, with the light-transmissive member 50 and the reflecting film 40, for example, cup-shaped so that the angle of incidence to the reflecting film becomes in a range from 0° to the first angle, light that transmits through the reflecting film 40 largely decreases to increase the returning light that returns to the fluorescent material layer 30, resulting in an increase in quantity of the second light released from the light emitting device 100.

The light emitting surface 23 of the light emitting element 20 is preferred to be in parallel with the reflecting film 40 corresponding to the first surface. This is because this configuration enables the angle of incidence A to be set to from 0° to the first angle to enhance reflection efficiency of the first light.

Thus, with the light-transmissive member 50 and the reflecting film 40 formed so that the angle of incidence A of the first light to the reflecting film 40 becomes in the range from 0° to the first angle, the first light can be inhibited from transmitting through the reflecting film 40 to provide the light emitting device 100 capable of reducing color shifting caused by visual observation at different angles.

The light-transmissive member 50 mainly transmits the second light. For the light-transmissive member 50, there can be used an inorganic material such as ceramics or glass, and an organic material such as a resin. The light-transmissive member 50 includes the first surface opposite to the light emitting surface 23 of the light emitting element 20 and the second surface bent toward the light emitting element and connected to the first surface. The light-transmissive member 50 is preferred to have a cup shape including the first surface that is flat. The second surface is preferred to be in parallel with a side surface of the light emitting element 20. The light-transmissive member may have a tunnel shape including bent surfaces opposite to each other and the other unbent surfaces opposite to each other. For example, a flat plate-shaped light-transmissive member can be used as the light-transmissive member 50, and partially bent, after the reflecting film 40 and the fluorescent material layer 30 are provided, to form these shapes.

The fluorescent material layer 30 disposed on the light emitting element 20 may be disposed with an adhesive agent layer 60 interposed between the light emitting element and the fluorescent material layer. The adhesive agent layer 60 is preferred to be light-transmissive. Use of the adhesive agent layer 60 enables easy disposition of the fluorescent material layer 30 on the light emitting element 20. The fluorescent material layer 30 disposed on the light emitting element 20 may directly be bonded without an adhesive agent interposed between the light emitting element and the fluorescent material layer. Direct bonding of the fluorescent material layer 30 to the light emitting element 20 enables heat generated in the fluorescent material layer 30 to be released through the light emitting element 20. In addition, the fluorescent material layer 30 on the light emitting element 20 may be disposed, not only without an adhesive agent interposed between the light emitting element and the fluorescent material layer but also being spaced apart from the light emitting element. This configuration does not allow direct transmission of heat from the light emitting element 20 to the fluorescent material layer 30, so that partial deterioration of the fluorescent material layer 30 can be reduced. The adhesive agent layer 60 may contain, for example, a light diffusing material. The adhesive agent layer containing a light diffusing material enables light diffusion and efficient release of heat from the light emitting element via, for example, the light-transmissive member.

The reflecting film 40 can be used alone but is preferred to be formed on the light-transmissive member 50 by, for example, printing or coating. Use of a high-strength member for the light-transmissive member 50 enables easy provision of the reflecting film 40. In addition, the reflecting film 40 can also be formed on the fluorescent material layer 30 by, for example, printing or coating.

The resin 70 disposed on the inner bottom surface 16 of the recess portion 15 may be disposed on a side surface of the light-transmissive member 50 except an upper surface of the light-transmissive member 50. Here, the upper surface of the light-transmissive member 50 is a part corresponding to the first surface in a plan view. In addition, the side surface of the light-transmissive member 50 is a part except the first surface in a plan view, for example, an outer surface of a part corresponding to the second surface.

The resin 70 preferably contains at least one light diffusing material selected from the group consisting of zirconium oxide, yttrium oxide, aluminum oxide, aluminum hydroxide, barium carbonate, barium sulfate, magnesium oxide, and magnesium carbonate. Thanks to the light diffusing material, the first light from the light emitting element 20 that has irradiated the resin 70 containing the light diffusing material can return toward the fluorescent material layer 30, so that light emission efficiency of the second light from the fluorescent material layer 30 can be enhanced. Alternatively, the resin 70 may contain titanium oxide. Titanium oxide does not reflect and absorbs light having a wavelength shorter than 420 nm, but efficiently reflects light having a wavelength longer than 420 nm. Therefore, the resin 70 can contain titanium oxide when the light emitting element 20 is used that has a peak emission wavelength in a wavelength range from 420 nm to 430 nm.

This configuration allows the light emitting device 100 to output light having substantially an equal light emission spectrum to the light emission spectrum of the second light emitted by the fluorescent material layer 30.

The light emitting element 20 includes a pair of positive and negative electrodes on a same surface side thereof, is face-down mounted, and is electrically connected to the first lead 11 and the second lead 12 with an electrically conductive bonding member. The light emitting element can be face-up mounted instead of being face-down mounted. When face-up mounted, the light emitting element may be connected to the first lead 11 and the second lead 12 with wire in place of the electrically conductive bonding member.

The reflecting film 40 is provided on the fluorescent material layer 30, reflects the first light emitted by the light emitting element 20, and transmits the second light emitted by the fluorescent material layer 30. The reflecting film 40 can be formed of, for example, a dielectric multi-layer film obtained by alternately stacking a first dielectric layer 41 and a second dielectric layer 42 that have different refractive indexes. The thickness of the first dielectric layer 41 and the thickness of the second dielectric layer 42 are set according to a first refractive index of the first dielectric layer 41 and a second refractive index of the second dielectric layer 42, respectively, so that the dielectric multi-layer film can be configured to reflect the first light emitted by the light emitting element 20 and transmit the second light emitted by the fluorescent material layer 30.

The light emitting device 100 can release the second light upward because the side surface of the light-transmissive member 50 is covered with the resin 70. Further, on the side surface of the light-transmissive member 50, the resin 70 can reflect the first light having transmitted through the reflecting film 40. The second light emitted by the fluorescent material layer 30 is output through the reflecting film 40, but the first light emitted by the light emitting element 20 is reflected on the reflecting film 40 and returned toward the fluorescent material layer 30 to excite the fluorescent material, so that light emission efficiency can be enhanced. This configuration allows reduction of release of the first light exteriorly released from the light emitting device 100, making the light exteriorly released from the light emitting device 100 substantially only the second light from the fluorescent material layer 30, so that color shifting can be prevented that occurs in a vertical or diagonal direction with respect to the semiconductor stacked-layer body 21.

In the light emitting device 100, when the dielectric multi-layer film is used as the reflecting film 40, almost all the light vertically (0°) incident to the dielectric multi-layer film that has a flat plate shape is reflected, but a part of the light that is not vertically incident transmits through the dielectric multi-layer film. In order to inhibit the light that is not vertically incident from being exteriorly output, the light-transmissive member 50 and the reflecting film 40 are partially bent to make most part of the first light from the light emitting element 20 incident at a near-vertical angle of incidence, so that the first light can be reduced that transmits through the reflecting film 40.

The light emitting device 100 emits light in a range surrounded by a quadrangle formed by connecting four points (x=0.645, y=0.335), (x=0.665, y=0.335), (x=0.735, y=0.265), and (x=0.721, y=0.259) in an xy chromaticity coordinate system of a CIE1931 chromaticity diagram. Such a configuration enables provision of the light emitting device that emits predetermined red light and reduces color shifting caused by visual observation at different angles.

The fluorescent material contained in the fluorescent material layer 30 is preferably at least one selected from fluorescent materials (Sr,Ca)AlSiN$_3$:Eu, CaAlSiN$_3$:Eu, and K$_2$SiF$_6$:Mn. The fluorescent materials may be combined. This configuration enables provision of the light emitting device that emits predetermined red light and reduces color shifting caused by visual observation at different angles.

The light emitting device 100 may be, for example, a shell type, a surface mounting type, or a chip type as long as the light-transmissive member 50 except the uppermost surface thereof is covered with the resin 70. Generally, the shell type light emitting device refers to a light emitting device in which a resin constituting an outer surface is formed into a shape of a shell type. Such a light emitting device includes, for example, a lead frame having a cup on one side thereof, a light emitting element disposed in the cup, and a sealing resin covering the light emitting element and a part of the lead frame. The surface mounting type light emitting device refers to a light emitting device obtained by mounting a light emitting element in a recessed storage portion and filling the light emitting element with a resin. As a material for the storage portion, exemplified are a thermoplastic resin, a thermosetting resin, ceramics, a metal or the like. The chip type light emitting device is a light emitting device that has, in contrast with the surface mounting type light emitting device, no recessed storage portion, and is obtained by directly forming a fluorescent material on a light emitting element and fixing, for example, a side surface of the light emitting element with a resin. In the chip type light emitting device, a layer containing a fluorescent material can be formed into a lens shape as well as a flat plate shape.

In the light emission spectrum of the light emitting device 100, the light emission peak intensity of the first light is preferably one tenth or less of the light emission peak intensity of the second light. In the light emission spectrum of the light emitting device 100, the light emission peak intensity of the first light is preferably one thirtieth or more of the light emission peak intensity of the second light. This configuration can make most part of the light released from the light emitting device 100 the second light, for example, red light.

Here, an example of the surface mounting type light emitting device is described in detail.

Base

For the fixing portion 13 and the side wall 14 of the base 10, there can be used, for example, a resin such as a thermoplastic resin or a thermosetting resin, an inorganic material such as ceramics or glass, and a metal that has been subjected to, for example, an insulation process. The fixing portion 13 and the side wall 14 of the base 10 may be formed of different members but are preferred to be integrally molded.

It is preferable that the base 10 of the surface mounting type light emitting device have an insulating property and be less likely to transmit light. As a material for the base 10, there can be exemplified ceramics such as alumina and aluminum nitride, and a resin such as a phenolic resin, an epoxy resin, a polyimide resin, a BT resin, or a polyphthalamide resin. When a resin is used as the material, an inorganic filler such as a glass fiber, silicon oxide, titanium oxide, or alumina may be mixed as necessary. Among these examples, ceramics are more preferable for their high heat releasing effect.

The base 10 includes the first lead 11, the second lead 12, and the fixing portion 13. As the base 10, there is mainly exemplified a top view type that releases light in a substantially vertical direction to a mounting surface and a side view type that releases light in a substantially parallel direction to a mounting surface. The present case is applicable to both the types. The first lead 11 and the second lead 12 are formed of a plate-shaped metal. Here, the first lead 11 and the second lead 12 do not exteriorly protrude from the fixing portion 13 when viewed from an opening direction of the recess portion 15. The first lead and the second lead, however, can also take a configuration of exteriorly protruding from the fixing portion 13.

A material that constitutes the first lead 11 and the second lead 12 is preferably, for example, a metal having a thermal conductivity of about 200 W/(m*K) or more or having relatively large mechanical strength, or a material that is easily processed by a punch press, etching, or the like. Specific examples of the material include metals such as copper, aluminum, gold, silver, tungsten, iron, and nickel, and alloys such as an iron-nickel alloy and phosphor bronze. Alternatively, a surface of a base material of the first lead 11 and the second lead 12 may be covered with, for example, silver, aluminum, or gold having a higher light reflectivity than the light reflectivity of the base material.

As the light emitting element 20, there can be used, for example, a light emitting diode (LED) chip or a laser diode (LD) chip. Especially, an LED chip is preferably used. With a light emitting diode chip used as the light emitting element 20, the light from the light emitting element 20 can easily broaden to efficiently excite the fluorescent material. As the light emitting element 20, there can be used, for example, a light emitting diode chip that includes a nitride semiconductor and emits light from a near-ultraviolet range to a blue color range. Here, the light emitting diode chip that emits light from a near-ultraviolet range to a blue color range refers to a light emitting diode chip having a peak emission wavelength in a range of 355 nm or longer and 485 nm or shorter. As the light emitting diode chip that emits light from a near-ultraviolet range to a blue color range, there can be used particularly one having a peak emission wavelength in a wavelength range of 355 nm or longer and shorter than 455 nm and one having a peak emission wavelength in a wavelength range of 455 nm or longer and 485 nm or shorter. The light emitting element 20 includes the semiconductor stacked-layer body 21 and the substrate 22. The semiconductor stacked-layer body 21 may be stacked on a substrate or may be attached to a substrate different from a growth substrate. Near-ultraviolet light having a wavelength shorter than 400 nm is less likely to be visually observed, so that light leaked from the light emitting device hardly affects a color hue. It is preferable, however, to inhibit the first light from transmitting through the reflecting film 40 for increasing the quantity of the second light.

The nitride semiconductor referred to herein is a semiconductor represented by the general formula $In_XAl_YGa_{1-X-Y}N(0 \leq X, 0 \leq Y, X+Y \leq 1)$, and the light emission wavelength can variously be selected by the composition of a semiconductor layer or the mixed crystallinity of the semiconductor layer. The light emitting element 20 including the nitride semiconductor includes the substrate 22 that allows growth of the nitride semiconductor, such as sapphire, and the semiconductor stacked-layer body 21 provided on the substrate 22.

In the light emitting element 20, the semiconductor stacked-layer body 21 includes the first semiconductor layer 21*a*, the active layer 21*b*, and the second semiconductor layer 21*c*. The first semiconductor layer 21*a* and the second semiconductor layer 21*c* have different polarities. For example, a p-type semiconductor layer and an n-type semiconductor layer are used for the first semiconductor layer 21*a* and the second semiconductor layer 21*c*, respectively, and a p-electrode is connected to the p-type semiconductor layer and an n-electrode is connected to the n-type semiconductor layer. The p-electrode and the n-electrode are preferably formed on a surface of the same side of the light emitting element 20 and flip-chip mounted on the first lead 11 and the second lead 12. This configuration makes an upper surface of the light emitting element 20 a flat surface, which makes it possible to closely dispose the fluorescent material layer 30 above the light emitting element 20. The light emitting element 20 includes the substrate 22. The substrate 22, however, may be removed during or after mounting to allow the fluorescent material layer 30 to be bonded onto the semiconductor stacked-layer body 21 directly or with the adhesive agent layer 60 interposed between the semiconductor stacked-layer body and the fluorescent material layer.

Fluorescent Material Layer

The fluorescent material layer 30 absorbs the first light from the light emitting element 20 and generates light having a different wavelength.

The fluorescent material layer 30 is formed by, for example, printing a light-transmissive resin paste containing particles of the fluorescent material on a surface of the light-transmissive member with the reflecting film 40 interposed between the fluorescent material layer and the light-transmissive member. The fluorescent material layer 30 may be formed of at least one layer. The fluorescent material layer 30 may contain a diffusing agent as necessary.

Here, at least one fluorescent material or fluorescent materials in combination are used that absorb the light from the light emitting element 20 having a peak emission wavelength in a wavelength range of 355 nm or longer and 485 nm or shorter and emit light having a peak emission wavelength in a wavelength range of 550 nm or longer and 780 nm or shorter. Here, the fluorescent material mainly emits red light as a light emission color. The fluorescent material only has to emit light having a peak emission wavelength in a wavelength range of 550 nm or longer and 780 nm or shorter, and is not limited to one having a light emission spectrum of 550 nm or longer and 780 nm or shorter. Particularly, the fluorescent material has a peak emission wavelength in a wavelength range of preferably 610 nm or longer and 680 nm or shorter, more preferably 610 nm or longer and 650 nm or shorter. This is because the visibility of light is peak at about 555 nm and decreases as the wavelength is longer than 555 nm, and therefore it is preferable to use, for improving the brightness, the fluorescent material having a peak emission wavelength in a wavelength range of 610 nm or longer and 650 nm or shorter that is relatively high in visibility in a red color range.

The average particle size of the fluorescent material is not particularly limited and can appropriately be selected according to the purpose or the like. The average particle size of the fluorescent material is preferably 1 μm or more and 20 μm or less, more preferably 5 μm or more and 15 μm or less, from the viewpoint of light emission efficiency.

When the entire volume of particles of the fluorescent material contained in a resin is the same, reduction of the particle size increases the surface area of the particles, making light emitted by a particle of the fluorescent material likely to be scattered by another particle of the fluorescent material to decrease light extraction efficiency. On the other hand, an increase in particle size decreases the scattering to enhance the light extraction efficiency, but reduces the surface area of particles to decrease the quantity of light emitted by the fluorescent material, increasing the quantity of light whose wavelength is not converted. The light whose wavelength has not been converted and reached the reflecting film 40 is returned toward the fluorescent material layer 30 again by the reflecting film, so that increasing the particle size of particles of the fluorescent material enables efficient wavelength conversion of the first light from the light emitting element 20 while reducing the scattering on surfaces of the particles. Accordingly, in the light emitting device 100, increasing the particle size of particles of the fluorescent material enables efficient wavelength conversion of the first light from the light emitting element 20 and improvement in light extraction efficiency.

The average particle size of particles of the fluorescent material referred to in the present specification means the average particle size of secondary particles formed through aggregation of primary particles. The average particle size (median size) of secondary particles can be measured by, for example, a laser diffraction particle size distribution measuring apparatus (product name: MASTER SIZER 3000 manufactured by Malvern Instruments Ltd.).

The fluorescent material layer 30 has a thickness ranging preferably from 30 μm to 150 μm, more preferably from 50 μm to 120 μm. This configuration can reduce the quantity of the second light lost through scattering in the fluorescent material layer 30 and increase the quantity of the second light output from the fluorescent material layer 30.

As the fluorescent material, there can be used, for example, a nitride-based fluorescent material, an oxide fluorescent material, a fluoride fluorescent material, and a sulfide fluorescent material.

The nitride-based fluorescent material is a fluorescent material that is activated with at least one rare-earth element selected from the group consisting of Y, La, Ce, Pr, Nd, Sm, Eu, Gd, Tb, Dy, Ho, Er, and Lu, and that contains at least one group II element selected from the group consisting of Be, Mg, Ca, Sr, Ba, and Zn, at least one group IV element selected from the group consisting of C, Si, Ge, Sn, Ti, Zr, and Hf, and N. The composition of this nitride-based fluorescent material may also include O.

Specific examples of the nitride-based fluorescent material include those represented by the general formulae $L_XM_YN_{(2/3)X+(4/3)Y)}$:R and $L_XM_YO_ZN_{((2/3)X+(4/3)Y-(2/3)Z)}$:R (L is at least one group II element selected from the group consisting of Be, Mg, Ca, Sr, Ba, and Zn; M is at least one group IV element selected from the group consisting of C, Si, Ge, Sn, Ti, Zr, and Hf; R is at least one rare-earth element selected from the group consisting of Y, La, Ce, Pr, Nd, Sm, Eu, Gd, Th, Dy, Ho, Er, and Lu; and X, Y, and Z satisfy $0.5 \leq X \leq 3$, $1.5 \leq Y \leq 8$, and $0 \leq Z \leq 3$, respectively).

More specific examples of the nitride-based fluorescent material include a SCASN-based fluorescent material represented by $(Sr,Ca)AlSiN_3$:Eu and a CASN-based fluorescent material represented by $CaAlSiN_3$:Eu.

Apart from the nitride-based fluorescent material, there can be used, for example, a KSF-based fluorescent material represented by $K_2SiF_6$:Mn and a sulfide-based fluorescent material.

The example so far described is for forming the fluorescent material layer 30 by printing a light-transmissive resin paste containing particles of the fluorescent material. The fluorescent material layer 30, however, may be formed by forming into a film a light-transmissive material, such as glass or an inorganic material, that contains the fluorescent material. In addition, although the form has been described in which the fluorescent material layer 30 is in direct contact with a surface of the reflecting film 40, the fluorescent material layer 30 does not necessarily need to be in direct contact with a surface of the reflecting film 40 but may be bonded to a surface of the reflecting film with another member such as an adhesive agent interposed between the fluorescent material layer and the reflecting film. For example, a plate-shaped fluorescent material may be formed by crimping, fusion, sintering, adhesion with an organic adhesive agent, or adhesion with an inorganic adhesive agent such as low melting temperature glass.

Reflecting Film

As the reflecting film 40, it is preferable to use a dielectric multi-layer film having high selectivity. The high selectivity here refers to high reflectivity in a reflective wavelength band, high transmissivity in a transmissive wavelength band, and a steep change in reflectivity or transmissivity between the reflective wavelength band and the transmissive wavelength band.

The dielectric multi-layer film is a reflecting film obtained by alternately and cyclically forming the two layers, the first dielectric layer 41 and the second dielectric layer 42 that have different refractive indexes, each at such a thickness as to give a phase difference of $\lambda/4$. Here, $\lambda$ is a peak wavelength in a wavelength range intended to be reflected, and an in-medium wavelength in each dielectric material. Logically, this dielectric multi-layer film is known to give a higher reflectivity along with an increase of difference in refractive index between the two layers, the first dielectric layer 41 and the second dielectric layer 42, or along with an increase in the number of alternate formation cycles. However, a too large difference in refractive index between the two layers, the first dielectric layer 41 and the second dielectric layer 42 or a too large number of cycles causes a sharp reduction in reflectivity on both sides of a reflection peak wavelength. (steep wavelength dependence) or increases the wavelength dependence of the reflectivity, making it difficult to stably obtain a desired reflectivity in a desired wavelength range. Therefore, the dielectric multi-layer film is appropriately set in terms of the refractive indexes of the first dielectric layer 41 made from a dielectric material having a high refractive index and the second dielectric layer 42 made from a dielectric material having a low refractive index, and the difference in refractive index between the layers, and the number of alternate formation cycles, so that a desired reflectivity in a desired wavelength range can stably be obtained.

Specifically, a first refractive index of the first dielectric layer 41 having a high refractive index is set to a range, for example, from 1.5 to 3.0, preferably from 2.0 to 2.6. A second refractive index of the second dielectric layer 42 having a low refractive index is set to a range, for example, from 1.0 to 1.8, preferably from 1.2 to 1.6. The number of alternate formation cycles of the first dielectric layer 41 and the second dielectric layer 42 is set to a range, for example, from 1 to 20, preferably from 1 to 5. The difference between the first refractive index and the second refractive index is preferably 0.3 or more, more preferably 0.5 or more, further preferably 0.7 or more.

The dielectric material that constitutes the first dielectric layer 41 can be selected from, for example, $TiO_2$, $Nb_2O_5$, $Ta_2O_5$, and $Zr_2O_5$. The dielectric material that constitutes the second dielectric layer 42 can be constituted by a material selected from, for example, $SiO_2$, $Al_2O_3$, and SiON.

Light-Transmissive Member

The light-transmissive member 50 has on one surface thereof the reflecting film 40 and the fluorescent material layer 30 provided, and supports the reflecting film 40 and the fluorescent material layer 30. For the light-transmissive member 50, there can be used a plate-shaped body made from a light-transmissive material such as glass or a resin. The glass can be selected from, for example, borosilicate glass and quartz glass. The resin can be selected from, for example, a silicone resin and an epoxy resin. The light-transmissive member 50 can have any thickness that does not decrease the mechanical strength in manufacturing steps and imparts sufficient mechanical strength to the fluorescent material layer 30. The light-transmissive member 50 may contain a diffusing agent. As the diffusing agent, there can be used, for example, titanium oxide, barium titanate, aluminum oxide, and silicon oxide. The upper surface of the light-transmissive member 50 is not limited to a flat surface but may have fine protrusions and recesses, the upper surface being to be a light emitting surface, i.e., a surface opposite from the surface on which are provided the reflecting film 40 and the fluorescent material layer 30. The light emitting surface having protrusions and recesses can scatter the light output from the light emitting surface to reduce unevenness in brightness and color.

Adhesive Agent Layer

The adhesive agent layer 60 adhesively attaches the light emitting element 20 to the fluorescent material layer 30. The adhesive agent layer 60 is preferred to be made from a material capable of guiding the light output from the light emitting element 20 to the fluorescent material layer 30 with the least attenuation of the light. Specific examples of the material include organic resins such as an epoxy resin, a silicone resin, a phenolic resin, and a polyimide resin, and a silicone resin is preferable. The adhesive agent layer 60 is preferable when the thickness thereof is thinner. This is because the adhesive agent layer that is thin can reduce loss of light that transmits through the adhesive agent layer and improve a heat releasing property to enhance the intensity of the light output from the light emitting device.

The adhesive agent layer 60 may be present not only between the light emitting element 20 and the fluorescent material layer 30 but also on a side surface of the light emitting element 20. When the fluorescent material layer 30 contains a silicone resin as a binder, the adhesive agent of the adhesive agent layer 60 is preferred to also contain a silicone resin. This configuration can reduce the difference in refractive index between the fluorescent material layer 30 and the adhesive agent layer 60 to increase the light that enters from the adhesive agent layer 60 to the fluorescent material layer 30.

Resin

As a material for the resin 70, it is preferable to use an insulating material. In order to secure a certain degree of strength, for example, a thermosetting resin or a thermoplastic resin can be used. More specific examples of the material include a phenolic resin, an epoxy resin, a BT resin, PPA, and a silicone resin. These resins to be base materials can be used with a reflecting member that is less likely to absorb the light from the light emitting element 20 and has a large difference in refractive index from the refractive index of the resins to be base materials. Specifically, it is possible to efficiently reflect light by dispersing at least one light diffusing material selected from the group consisting of zirconium oxide, yttrium oxide, aluminum oxide, aluminum hydroxide, barium carbonate, barium sulfate, magnesium oxide, and magnesium carbonate.

Reflectivity

Figure 3:
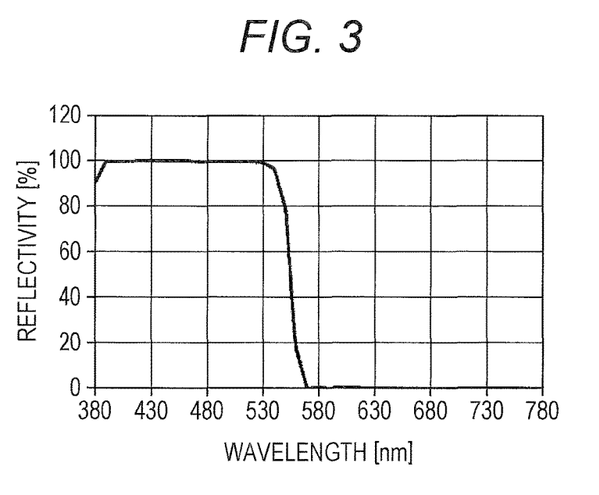
FIG. 3 is a schematic diagram illustrating reflectivity of a reflecting film for wavelengths of normal incident light (an angle of incidence of 0°) in the light emitting device according to the first embodiment.
Figure 4:
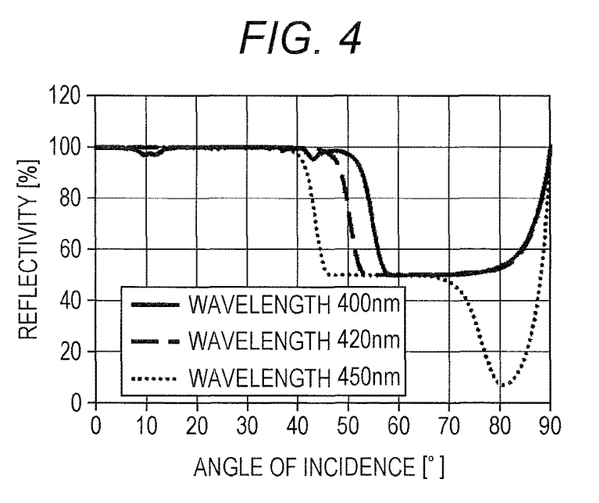
FIG. 4 is a schematic diagram illustrating reflectivity of first light emitted by the light emitting element at angles of incidence of the light to the reflecting film.
Figure 5:
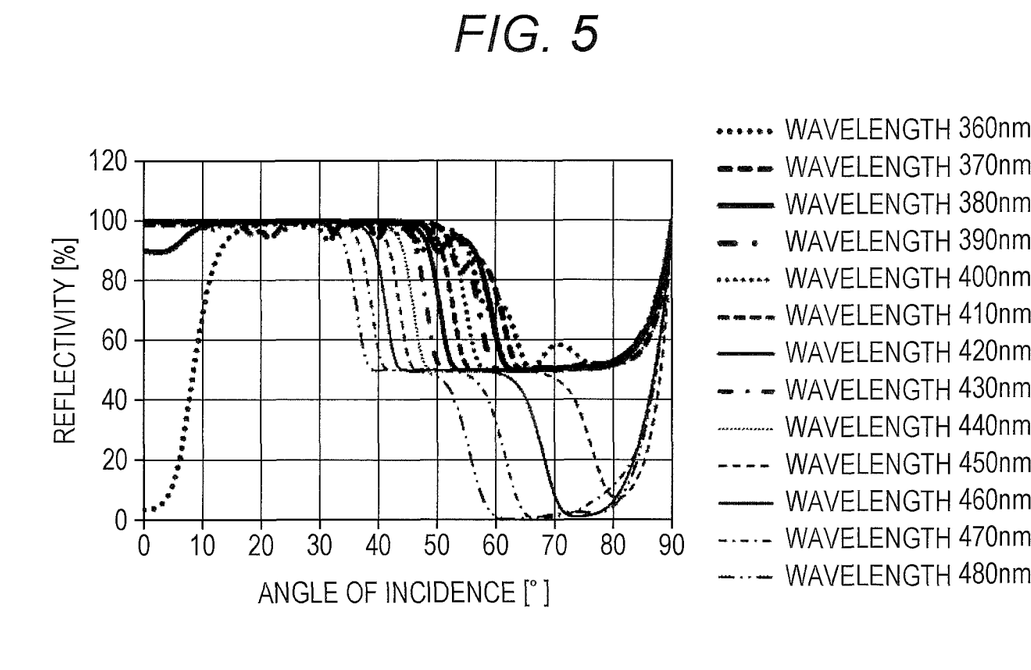
FIG. 5 is a schematic diagram illustrating reflectivity of the first light emitted by the light emitting element at angles of incidence of the light to the reflecting film.

FIG. 3 is a schematic diagram illustrating reflectivity of the reflecting film for wavelengths of normal incident light (an angle of incidence of 0°) in the light emitting device according to Example 1. FIG. 3 is a simulation. FIGS. 4 and 5 are schematic diagrams illustrating reflectivity of the first light emitted by the light emitting element at angles of incidence of the light to the reflecting film. FIG. 4 is an excerpt from FIG. 5.

The reflecting film 40 has different reflectivities for wavelengths. For example, for light having a wavelength of 360 nm, the reflecting film has a part low in reflectivity at an angle of incidence A of from 0° to 20°, has a reflectivity of near 100% at an angle of incidence A of from 20° to 50°, and has a decreased reflectivity up to near 50% at an angle of incidence A of from 50° to 80°.

For light having a wavelength of 400 nm, the reflecting film has a reflectivity of near 100% at an angle of incidence A of from 0° to 50° and has a decreased reflectivity up to near 50% at an angle of incidence A of from 50° to 80°.

For light having a wavelength of 420 nm, the reflecting film has a reflectivity of near 100% at an angle of incidence A of from 0° to 40° and has a decreased reflectivity up to near 50% at an angle of incidence A of from 40° to 80°.

For light having a wavelength of 450 nm, the reflecting film has a reflectivity of near 100% at an angle of incidence A of from 0° to 40°, has a decreased reflectivity up to near 50% at an angle of incidence A of from 40° to 70°, and has a decreased reflectivity up to near 10% at an angle of incidence A of from 70° to 85°.

Therefore, according to selection of a peak emission wavelength of the light emitting element 20 used, it is possible to broaden the first surface of the light-transmissive member 50 on which the reflecting film 40 is provided, so that the light emitting element 20 can be used that has a large shape in a plan view. That is, when the light emitting element 20 having a peak emission wavelength of 460 nm is used, it is necessary to keep the first surface of the light-transmissive member 50 within a range where the angle of incidence is up to 40°, whereas when the light emitting element 20 having a peak emission wavelength of 400 nm is used, it is possible to broaden the first surface of the light-transmissive member 50 to a range where the angle of incidence is up to 50°.

As described above, it is possible to efficiently irradiate the fluorescent material layer 30 with the first light from the light emitting element 20 by appropriately changing, for example, the light emitting element 20 used and the material for the reflecting film 40.

Manufacturing Method

Described is a method of manufacturing the light emitting device according to the first embodiment.

The light-transmissive member 50 is prepared that has a cup shape including, on the inner surface thereof, the first surface and the second surface bent and connected to the first surface. The light-transmissive member 50 may be individual pieces or may be continuous with, for example, a connecting member interposed between the pieces.

On the inner surface of the cup shape of the light-transmissive member 50 is formed the reflecting layer 40 that is the dielectric multi-layer film including alternately stacked dielectric layers having different refractive indexes. As the dielectric layers, for example, a niobium oxide layer(s) and a silicon oxide layer(s) are alternately stacked to form a plurality of stacked layers. The reflectivity can be changed according to the number of stacked layers.

The fluorescent material layer 30 is formed on the reflecting layer 40. For forming the fluorescent material layer 30, there can be used methods such as potting, spraying, and printing. The fluorescent material layer 30 can include not only a single layer but also a plurality of layers including two or more layers. In addition, the fluorescent material layer 30 can contain not only a single fluorescent material but also two or more fluorescent materials. The thickness of the fluorescent material layer is not particularly limited but is preferably from 30 m to 150 μm, particularly preferably from 50 μm to 120 μm.

The fluorescent material layer 30 is disposed on the light emitting element 20 so that the light emitting surface of the light emitting element 20 is opposite to the first surface that is the inner surface of the cup shape of the light-transmissive member 50. For example, with the opening of the light-transmissive member 50 having the cup shape directed upward, the cup is filled with the adhesive agent layer 60, in which the light emitting element 20 disposed on the base 10 is immersed. Thus, the adhesive agent layer 60 can be provided on an upper surface and a side surface of the light emitting element 20. Alternatively, it is also possible to dispose only the light emitting element 20 in the cup shape without disposing the light emitting element 20 on the base 10 in advance, cure the adhesive agent layer 60, and then bond onto the base 10 the light emitting element 20 covered with the light-transmissive member 50. Further, it is also possible to apply onto the light emitting element 20 the adhesive agent layer 60 that is liquid and bond the light emitting element 20 to the light transmissive member 50 in such a manner that the light-transmissive member is placed like a lid on the light emitting element. The adhesive agent layer 60 completed starts to flow to a side surface of the light emitting element 20 to cover the side surface of the light emitting element 20. In the meantime, it is preferable to use the light emitting element 20 that is disposed in advance on the base 10 with an electrically conductive member such as gold or copper.

The resin 70 containing a reflective member is added dropwise into the recess portion 15 of the base 10 to dispose the resin 70 on an outer surface of a part corresponding to the second surface of the light-transmissive member 50. This process reduces a light emitting area to enhance the brightness.

As described above, the light emitting device 100 according to the first embodiment can be manufactured.

Second Embodiment

Figure 6:
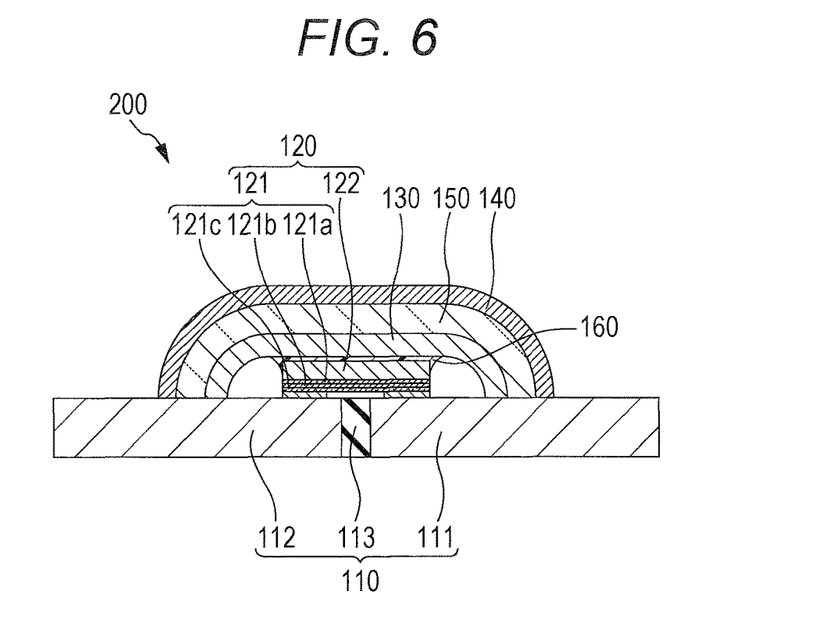
FIG. 6 is a schematic sectional view illustrating one example of a light emitting device according to a second embodiment.

A light emitting device according to a second embodiment is described with reference to a drawing. FIG. 6 is a schematic sectional view illustrating one example of the light emitting device according to the second embodiment. The second embodiment is almost the same as the first embodiment except the disposition order of the fluorescent material layer, the reflecting film, and the light-transmissive member, the form of the base, and the form of the adhesive agent layer. Description is sometimes omitted for parts that overlap with the first embodiment.

A light emitting device 200 includes a base 110, a light emitting element 120 disposed on the base 110, a fluorescent material layer 130 disposed on the light emitting element 120, a light-transmissive member 150 provided on the fluorescent material layer 130, and a reflecting film 140 provided on the light-transmissive member 150. The base 110 includes a first lead 111, a second lead 112, and a fixing portion 113 disposed between the first lead 111 and the second lead 112. The base 110 has a flat plate shape. In the light emitting element 120, a semiconductor stacked-layer body 121 including a first semiconductor layer 121a, an active layer 121b, and a second semiconductor layer 121c is provided on a substrate 122. The light-transmissive member 150 includes a first surface opposite to a light emitting surface of the light emitting element 120 and a second surface bent toward the light emitting element and connected to the first surface. The first surface of the light-transmissive member 150 is flat and the light-transmissive member forms a cup shape. The fluorescent material layer 130 is provided on an inner surface of the cup shape of the light-transmissive member 150 and the reflecting film 140 is provided on an outer surface of the cup shape of the light-transmissive member 150. Both the fluorescent material layer 130 and the reflecting film 140 include parts in parallel with the first surface and the second surface of the light-transmissive member 150. In addition, the fluorescent material layer 130, the light-transmissive member 150, and the reflecting film 140 are preferred to be similar figures. The fluorescent material layer 130 can be provided on one surface of the light-transmissive member 150 and the reflecting film 140 can be provided on the other surface of the light-transmissive member 150 to increase adhesiveness between the light-transmissive member 150 and the fluorescent material layer 130 and adhesiveness between the light-transmissive member 150 and the reflecting film 140 and to facilitate the manufacturing of the light emitting device.

For the light emitting device 200, the light-transmissive member 150 is prepared that has a cup shape including, on the inner surface thereof, the first surface and the second surface bent and connected to the first surface.

On the outer surface of the cup shape of the light-transmissive member 150 is formed the reflecting layer 140 that is a dielectric multi-layer film including alternately stacked dielectric layers having different refractive indexes. Further, on the inner surface of the cup shape of the light-transmissive member 150 is formed the fluorescent material layer 130. The order of steps of forming the reflecting film 140 and forming the fluorescent material layer 130 may be the other way around or simultaneous.

The light-transmissive member 150 is disposed on the light emitting element 120 so that the light emitting surface of the light emitting element 120 is opposite to the first surface that is the inner surface of the cup shape of the light-transmissive member 150. The light emitting element 120 is disposed in advance on the base 110 that has a flat plate shape. An adhesive agent layer 160 is applied to an upper surface of the light emitting element 120, which is covered with the light-transmissive member 150 having the cup shape. The weight of the light-transmissive member 150 itself can make the light emitting surface of the light emitting element 120 in parallel with the first surface of the light-transmissive member 150.

As described above, the light emitting device 200 can easily be manufactured.

Third Embodiment

Figure 7:
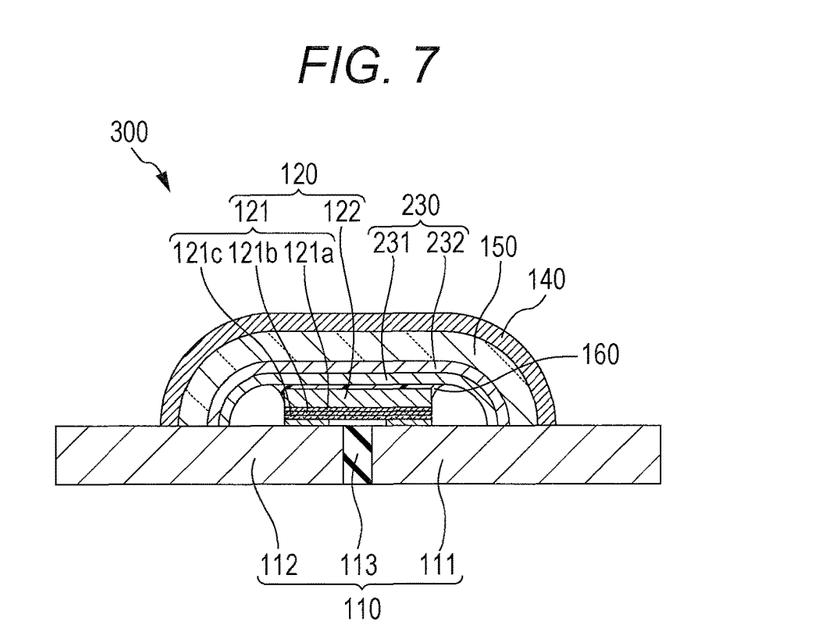
FIG. 7 is a schematic sectional view illustrating one example of a light emitting device according to a third embodiment.
Figure 8:
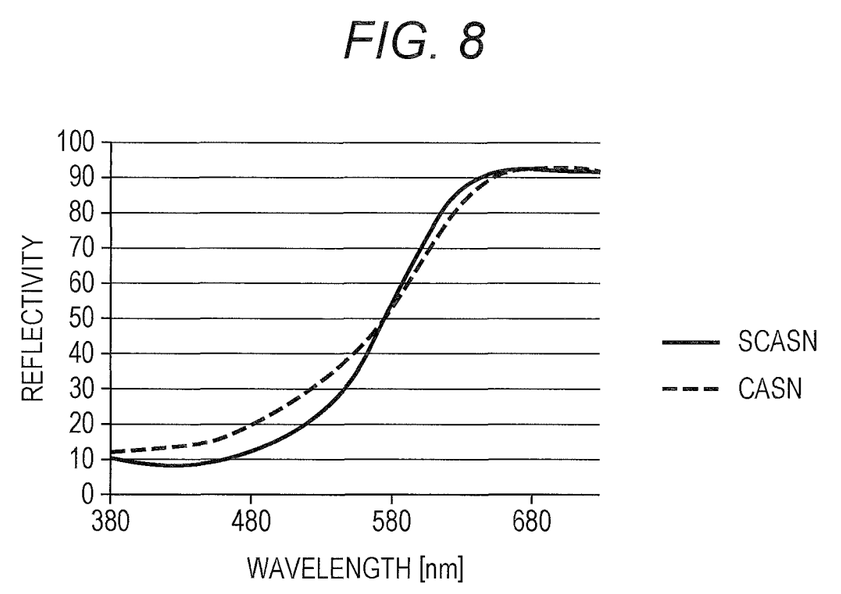
FIG. 8 is a schematic spectrum diagram illustrating reflectivity of powders of fluorescent materials $(Sr,Ca)AlSiN_3$:Eu and $CaAlSiN_3$:Eu.

A light emitting device according to a third embodiment is described with reference to drawings. FIG. 7 is a schematic sectional view illustrating one example of the light emitting device according to the third embodiment. FIG. 8 is a schematic spectrum diagram illustrating reflectivity of powders of fluorescent materials $(Sr,Ca)AlSiN_3$:Eu and $CaAlSiN_3$:Eu. The third embodiment is almost the same as the second embodiment except that the form of the fluorescent material layer is different from the second embodiment. Description is sometimes omitted for parts that overlap with the second embodiment.

A light emitting device 300 includes a base 110, a light emitting element 120 disposed on the base 110, a fluorescent material layer 230 disposed on the light emitting element 120, a light-transmissive member 150 provided on the fluorescent material layer 230, and a reflecting film 140 provided on the light-transmissive member 150. The fluorescent material layer 230 has a fluorescent material $CaAlSiN_3$:Eu layer 231 disposed on a near side to the light emitting element 120 and a fluorescent material $(Sr,Ca)$ $AlSiN_3$:Eu layer 232 disposed on a far side from the light emitting element. The disposition of the layers in this order can enhance the light emission efficiency in comparison with a fluorescent material layer having the fluorescent materials $CaAlSiN_3$:Eu and $(Sr,Ca)AlSiN_3$:Eu dispersed therein to provide a bright light emitting device. This is considered to be because the fluorescent material $CaAlSiN_3$:Eu has a higher reflectivity than the reflectivity of the fluorescent material $(Sr,Ca)AlSiN_3$:Eu at the vicinity of the light emission wavelength of the light emitting element 120 ranging from 440 nm to 480 nm, enabling returning again, to the fluorescent material $CaAlSiN_3$:Eu layer 231, the blue light from the light emitting element 120 that is reflected on an interface between the fluorescent material $CaAlSiN_3$:Eu layer 231 and the fluorescent material $(Sr,Ca)AlSiN_3$:Eu layer 232, to thus amplify the light emitted by the fluorescent material $CaAlSiN_3$:Eu. The fluorescent material $(Sr,Ca)$ $AlSiN_3$:Eu, which has a lower reflectivity and a higher light absorption than the reflectivity and the light absorption of the fluorescent material $CaAlSiN_3$:Eu at the vicinity of the light emission wavelength of the light emitting element 120, can be disposed as the upper layer to reduce the blue light that transmits through the fluorescent material $(Sr,Ca)$ $AlSiN_3$:Eu layer.

For the light emitting device 300, the light-transmissive member 150 is prepared that has a cup shape including, on an inner surface thereof, the first surface and the second surface bent and connected to the first surface.

On the outer surface of the cup shape of the light-transmissive member 150 is formed the reflecting layer 140 that is a dielectric multi-layer film including alternately stacked dielectric layers having different refractive indexes. Further, on the inner surface of the cup shape of the light-transmissive member 150 is formed the fluorescent material layer 230 including the fluorescent material $(Sr,Ca)$ $AlSiN_3$:Eu layer 232 and the fluorescent material $CaAlSiN_3$: Eu layer 231 in this order. The order of steps of forming the reflecting film 140 and forming the fluorescent material layer 230 may be the other way around or simultaneous. The thickness of the fluorescent material $CaAlSiN_3$:Eu layer 231 and the fluorescent material $(Sr,Ca)AlSiN_3$:Eu layer 232 is about 100 μm.

The light-transmissive member 150 is disposed on the light emitting element 120 so that the light emitting surface of the light emitting element 120 is opposite to the first surface that is the inner surface of the cup shape of the light-transmissive member 150. The light emitting element 120 is disposed in advance on the base 110 that has a flat plate shape. An adhesive agent layer 160 is applied to an upper surface of the light emitting element 120, which is covered with the light-transmissive member 150 having the cup shape. The weight of the light-transmissive member 150 itself can make the light emitting surface of the light emitting element 120 in parallel with the first surface of the light-transmissive member 150.

As described above, the light emitting device 300 can easily be manufactured.

INDUSTRIAL APPLICABILITY

The light emitting devices according to the present embodiments can be used in a wide range of fields, e.g., a general light, a vehicle light, a light for appreciation, a warning lamp, and an indicating lamp. For example, when a light emitting device used for a vehicle rear lamp, a vehicle brake lamp, or the like is configured by incorporating a light emitting diode that emits light from a near-ultraviolet range to a blue color range, for example, a nitride-based fluorescent material can be used.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
    a light emitting element having a light emitting surface from which the light emitting element is configured to emit a first light having a first peak wavelength;
    a light transform layer provided on the light emitting surface to transform the first light to a second light having a second peak wavelength longer than the first peak wavelength;
    a light-transmissive layer provided on the light transform layer and comprising:
        a first surface that has a substantially flat shape and that is opposite to the light emitting surface; and
        a second surface connected to the first surface and having a curved shape to surround the light emitting element; and
    a reflecting film provided between the light transform layer and the light-transmissive layer to extend along the first surface and the second surface so as to reflect the first light and to transmit the second light.

2. The light emitting device according to claim 1, wherein the light transform layer and the reflecting film include a first part substantially parallel to the first surface and a second part substantially parallel to the second surface of the light-transmissive layer.

3. The light emitting device according to claim 1, wherein
    the first light is emitted in a light emitting direction to an incident position of the reflecting film,
    an incident angle of the first light is viewed in a direction perpendicular to a plane parallel to the light emitting direction and a normal vector of the reflecting film at the incident position, and
    the reflecting film has a reflectivity of 95% or more at the incident angle of the first light which is in a first range from 0° to a first angle, and a reflectivity of 20% or more and 70% or less at the incident angle of the first light which is in a second range from the first angle to a second angle.

4. The light emitting device according to claim 1, wherein
    the first light is emitted in a light emitting direction to an incident position of the reflecting film,
    an incident angle of the first light is viewed in a direction perpendicular to a plane parallel to the light emitting direction and a normal vector of the reflecting film at the incident position, and
    the reflecting film further includes a third part having a reflectivity of 20% or less at the incident angle of the first light which is in a third range from the second angle to a third angle.

5. The light emitting device according to claim 1, wherein
    the light emitting element includes a first semiconductor layer, a second semiconductor layer, and an active layer stacked between the first semiconductor layer and the second semiconductor layer, the active layer having a center viewed in a plan view of the light emitting element, and
    the second surface of the light-transmissive layer receives first lights emitted from the center of the active layer at respective incidence angles within a range from 0° to the first angle in a sectional view.

6. The light emitting device according to claim 1, wherein the light emitting surface of the light emitting element is substantially parallel to a surface of the reflecting film which corresponds to the first surface.

7. The light emitting device according to claim 1, wherein the first peak emission wavelength is equal to or longer than 355 nm and shorter than 455 nm.

8. The light emitting device according to claim 1, wherein the first peak emission wavelength is equal to or longer than 455 nm and shorter than 485 nm.

9. The light emitting device according to claim 1, wherein a part of the reflecting film provided on the first surface entirely overlaps with the light emitting surface of the light emitting element viewed along a height of the light emitting device.

10. The light emitting device according to claim 1, wherein the light-transmissive layer has a cup shape defined by the first surface and the second surface.

11. The light emitting device according to claim 1, wherein a light emission peak intensity of the first light is one tenth or less of a light emission peak intensity of the second light in a light emission spectrum of the light emitting device.

12. The light emitting device according to claim 1, wherein the light emission peak intensity of the first light is one thirtieth or more of the light emission peak intensity of the second light in a light emission spectrum of the light emitting device.

13. The light emitting device according to claim 1, wherein the reflecting film includes a dielectric multi-layer film.

14. The light emitting device according to claim 1, wherein the light transform layer includes a first fluorescent material layer made of $CaAlSiN_3$:Eu and a second fluorescent material layer made of $(Sr,Ca)AlSiN_3$:Eu stacked on the first fluorescent material layer, the first fluorescent material layer being disposed closer to the light emitting element than the second fluorescent material layer.

15. The light emitting device according to claim 1, wherein the light transform layer comprises a fluorescent material to be excited by the first light to emit the second light.

16. The light emitting device according to claim 1,
    wherein the light-transmissive layer does not contain fluorescent material, and
    wherein a side surface of the light-transmissive layer is covered with a resin.

17. The light emitting device according to claim 16, wherein the resin directly contacts the light-transmissive layer.

18. The light emitting device according to claim 16, wherein a part of the light-transmissive layer located directly above the light emitting element is exposed from the resin.

19. A light emitting device comprising:
    a light emitting element having a light emitting surface from which the light emitting element is configured to emit a first light in a light emitting direction, the first light having a first peak wavelength;
    a light transform layer provided on the light emitting surface to transform the first light to a second light having a second peak wavelength longer than the first peak wavelength;
    a reflecting film provided on the light transform layer to reflect the first light and to transmit the second light; and a light-transmissive layer provided between the light transform layer and the reflecting film and comprising:
- a first surface that has a substantially flat shape and that is opposite to the light emitting surface;
- a third surface that has a substantially flat shape and that is opposite to the first surface in the light emitting direction; and
- a fourth surface connected to the third surface and having a curved shape to surround the light emitting element, the light-transmissive layer extending along the third surface and the fourth surface.

20. The light emitting device according to claim 19, wherein the light transform layer comprises a fluorescent material to be excited by the first light to emit the second light.

21. A method of manufacturing a light emitting device, comprising:
- providing a light-transmissive layer having a cup shape having a hollow, the light-transmissive layer including a first surface and a second surface to define the hollow, the first surface being provided at a bottom of the hollow and having a substantially flat shape, the second surface being connected to the first surface and having a curved surface;
- providing a reflecting layer on the first surface and the second surface of the light-transmissive layer to extend along the first surface and the second surface, the reflecting layer including a dielectric multi-layer film in which dielectric layers having different refractive indexes are alternately stacked;
- providing a light transform layer on the reflecting layer such that the reflecting film is provided between the light transform layer and the light-transmissive layer; and
- providing a light emitting element on the light transform layer so that a light emitting surface of the light emitting element is opposite to the first surface of the light-transmissive layer.

22. A method of manufacturing a light emitting device, comprising:
- providing a light-transmissive layer having a cup shape having an inner peripheral surface to define a hollow of the cup shape and an outer peripheral surface surrounding the inner peripheral surface, the outer peripheral surface including a third surface and a fourth surface, the third surface being provided opposite to a bottom of the hollow and having a substantially flat shape, the fourth surface being connected to the third surface and having a curved shape to surround the hollow;
- providing a reflecting layer on the outer peripheral surface of the light-transmissive layer to extend along the third surface and the fourth surface, the reflecting layer including a dielectric multi-layer film in which dielectric layers having different refractive indexes are alternately stacked;
- providing a light transform layer on the inner peripheral surface of the light-transmissive layer; and
- providing a light emitting element on the light transform layer so that a light emitting surface of the light emitting element is opposite to the bottom of the hollow in the light-transmissive layer.

\* \* \* \* \*